(12) United States Patent
Tsujino et al.

(10) Patent No.: US 9,408,307 B2
(45) Date of Patent: Aug. 2, 2016

(54) DEVICE HOUSING PACKAGE

(71) Applicant: KYOCERA Corporation, Kyoto-shi, Kyoto (JP)

(72) Inventors: Mahiro Tsujino, Kyoto (JP); Eiichi Katayama, Kyoto (JP); Emi Mukai, Kyoto (JP); Atsushi Ogasawara, Kyoto (JP)

(73) Assignee: Kyocera Corporation, Kyoto (JP)

( * ) Notice: Subject to any disclaimer, the term of this patent is extended or adjusted under 35 U.S.C. 154(b) by 167 days.

(21) Appl. No.: 14/382,801

(22) PCT Filed: Mar. 5, 2013

(86) PCT No.: PCT/JP2013/055955
§ 371 (c)(1),
(2) Date: Sep. 4, 2014

(87) PCT Pub. No.: WO2013/141013
PCT Pub. Date: Sep. 26, 2013

(65) Prior Publication Data
US 2015/0016074 A1    Jan. 15, 2015

(30) Foreign Application Priority Data

Mar. 22, 2012  (JP) .................................. 2012-065758
Nov. 22, 2012  (JP) .................................. 2012-255862

(51) Int. Cl.
*H05K 5/00*    (2006.01)
*H05K 1/18*    (2006.01)
(Continued)

(52) U.S. Cl.
CPC .............. *H05K 1/181* (2013.01); *H01L 23/057* (2013.01); *H05K 1/162* (2013.01); *H05K 1/167* (2013.01); *H05K 1/184* (2013.01); *H05K 1/189* (2013.01); *H01L 2924/0002* (2013.01); *H05K 2201/0344* (2013.01); *H05K 2201/10075* (2013.01); *H05K 2201/10083* (2013.01); *H05K 2201/10143* (2013.01); *H05K 2201/10166* (2013.01); *H05K 2201/10174* (2013.01); *H05K 2201/10196* (2013.01)

(58) Field of Classification Search
CPC ................... H01L 2924/0002; H01L 2924/00; H01L 23/057; H05K 1/162; H05K 1/167; H05K 1/181; H05K 1/184; H05K 1/189; H05K 2201/0344; H05K 2201/10075; H05K 2201/10083; H05K 2201/10143; H05K 2201/10166
See application file for complete search history.

(56) References Cited

U.S. PATENT DOCUMENTS 6,528,724 B1 *  3/2003  Yoshida ................ B81C 1/0015
                                                         174/541
6,906,412 B2 *  6/2005  Furukubo ............. B81B 7/0048
                                                         257/698

(Continued)

FOREIGN PATENT DOCUMENTS

JP     2004-356391 A     12/2004
JP     2006-66867 A       3/2006

(Continued)

OTHER PUBLICATIONS

International Search Report, PCT/JP2013/055955, Mar. 28, 2013, 1 pg.

*Primary Examiner* — Yuriy Semenenko
(74) *Attorney, Agent, or Firm* — Volpe and Koenig, P.C.

(57) ABSTRACT

A device housing package includes a substrate in a form of a rectangle, having a mounting region of a device at an upper surface thereof; a frame body disposed on the substrate so as to extend along an outer periphery of the mounting region, the frame body having a cutout formed at a part thereof; and an input-output terminal disposed in the cutout. The input-output terminal includes a first insulating layer, a second insulating layer overlaid on the first insulating layer, and a third insulating layer overlaid on the second insulating layer. First terminals set at a predetermined potential are disposed on an upper surface of the first insulating layer. Second terminals set at a predetermined potential are disposed on a lower surface of the first insulating layer. Third terminals through which AC signals flow are disposed on an upper surface of the second insulating layer.

8 Claims, 6 Drawing Sheets

(51) Int. Cl.
*H01L 23/057* (2006.01)
*H05K 1/16* (2006.01)

(56) References Cited

U.S. PATENT DOCUMENTS

| | | |
|---|---|---|
| 2005/0207092 A1 | 9/2005 | Kubota et al. |
| 2007/0132094 A1* | 6/2007 | Shimura ............... H01L 23/055 257/729 |
| 2007/0273008 A1* | 11/2007 | Suzuki .................. H01L 23/04 257/659 |
| 2009/0101396 A1* | 4/2009 | Mizuno ................ H05K 1/0243 174/260 |
| 2010/0252313 A1 | 10/2010 | Tsujino |

FOREIGN PATENT DOCUMENTS

| | | |
|---|---|---|
| JP | 2006-210672 A | 8/2006 |
| WO | 2009/057691 A1 | 5/2009 |

\* cited by examiner

DEVICE HOUSING PACKAGE

TECHNICAL FIELD

The present invention relates to a device housing package for mounting and housing a device so as to serve as a mounting structure.

BACKGROUND ART

In keeping with the recent trend toward apparatus miniaturization, compact device housing packages capable of mounting a device such as an IC, a light-emitting diode, a piezoelectric element, or a crystal oscillator have been under development. Specifically, a package for use with optical semiconductors capable of mounting an optical semiconductor device such as a laser diode or a photodiode is proposed (for example, refer to Japanese Unexamined Patent Publication JP-A 2006-66867). The electronic component housing package as proposed in JP-A 2006-66867 comprises: a metal-made base body; an input-output terminal disposed on the base body; and a plurality of lead terminals disposed on each of the upper and lower surfaces of the input-output terminal.

In the electronic component housing package as proposed in JP-A 2006-66867, however, when it is desired to increase the number of lead terminals that are attached to the input-output terminal with consideration given to growing sophistication of devices to be mounted, without upsizing of the package, it will be difficult to fulfill the desire. Compounding the problem, the upsizing of the package in itself leads to the possibility of an increase in size of equipment in which the electronic component housing package is mounted.

An object of the invention is to provide a device housing package capable of an increase in the number of lead terminals without the necessity of upsizing the package in itself.

DISCLOSURE OF INVENTION

A device housing package in accordance with one embodiment of the invention comprises: a substrate in a form of a rectangle, having a mounting region of a device at an upper surface thereof; a frame body disposed on the substrate so as to extend along an outer periphery of the mounting region, the frame body having a cutout formed at a part thereof; and an input-output terminal which is disposed in the cutout so as to extend from a region thereof, which is surrounded with the frame body, to a region which is not surrounded with the frame body. The input-output terminal includes: a first insulating layer; a second insulating layer overlaid on the first insulating layer; and a third insulating layer overlaid on the second insulating layer. The first insulating layer extends outwardly from the frame body beyond the second insulating layer and the third insulating layer. The second insulating layer extends outwardly beyond the third insulating layer from the frame body. A plurality of first terminals set at a predetermined potential are disposed on an upper surface of the first insulating layer. A plurality of second terminals set at a predetermined potential are disposed on a lower surface of the first insulating layer. A plurality of third terminals through which AC signals flow are disposed on an upper surface of the second insulating layer.

DESCRIPTION OF EMBODIMENTS

Figure 1:
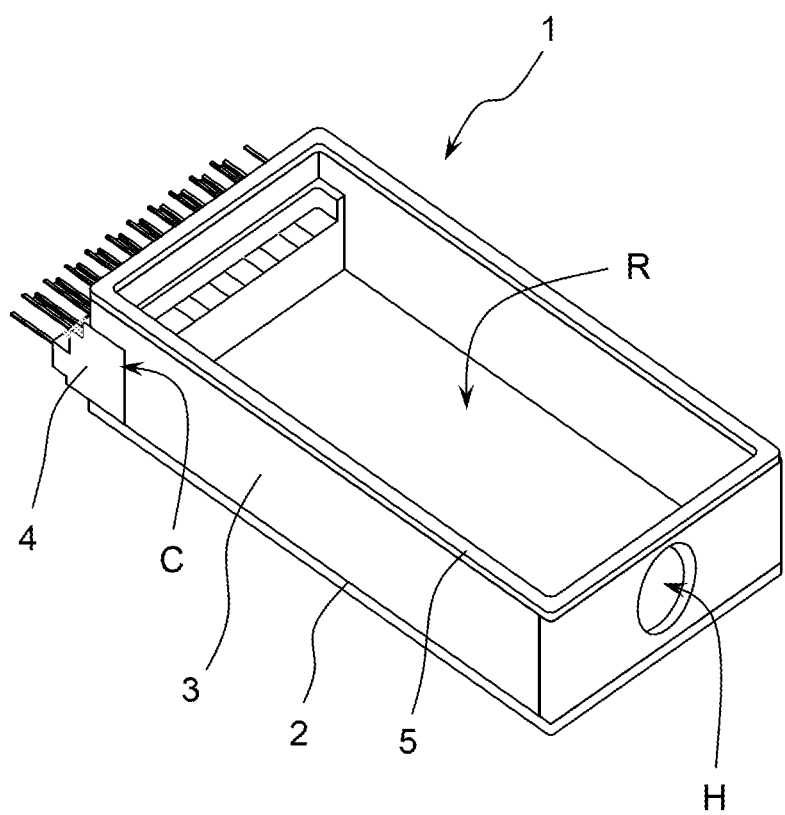
FIG. 1 is a perspective top view of a device housing package in accordance with one embodiment of the invention, schematically showing the device housing package as viewed from the rear to the front of an input-output terminal.

Hereinafter, a device housing package in accordance with one embodiment of the invention will be described with reference to the drawings.

<Structure of Device Housing Package>

A device housing package 1 is used for the mounting of a device constructed of, for example, an active element such as a semiconductor element, a transistor, a diode, or a thyristor, or a passive element such as a resistor, a capacitor, a solar cell, a piezoelectric element, a crystal oscillator, or a ceramic oscillator. The device housing package 1 is suitable for the mounting and operation of a device adapted to higher withstand voltage, larger electric current, or higher speed/frequency, and, as an example of the device, a semiconductor device is mounted in the device housing package 1. Moreover, the device housing package 1 comprises: a substrate 2 in a form of a rectangle, having a mounting region R of a device at an upper surface thereof; a frame body 3 disposed on the substrate 2 so as to extend along an outer periphery of the mounting region R, the frame body having a cutout C formed at a part thereof; and an input-output terminal 4 which is disposed in the cutout C so as to extend from a region thereof, which is surrounded with the frame body 3, to a region which is not surrounded with the frame body 3.

The substrate 2 is a rectangular metal plate made of, for example, a metal material such as copper, iron, tungsten, molybdenum, nickel, or cobalt, or an alloy containing such metal materials. The thermal conductivity of the substrate 2 is set to fall in the range of 15 W/(m·K) or more and 450 W/(m·K) or less, for example. The thermal expansion coefficient of the substrate 2 is set to fall in the range of $3 \times 10^{-6}$/K or more and $28 \times 10^{-6}$/K or less, for example.

Moreover, the substrate 2 is formed in a predetermined shape by performing heretofore known metalworking process, such as rolling process or punching process, on an ingot obtained by casting a molten metal material in a mold and solidifying the molten metal material. The length of one side of the substrate 2 as seen in a plan view is set to fall in the range of 5 mm or more and 50 mm or less, for example. Moreover, the thickness of the substrate 2 in the vertical direction thereof is set to fall in the range of 0.3 mm or more and 5 mm or less, for example.

Moreover, in the interest of prevention of oxidative corrosion, a nickel- or gold-made metal layer is formed on the surface of the substrate 2 by electroplating technique or electroless plating technique. The thickness of the metal layer is set to fall in the range of 0.5 μm or more and 9 μm or less, for example.

The frame body 3 is a member connected so as to extend along the outer periphery of the mounting region R, for providing external protection for the device mounted on the mounting region R. The frame body 3 has the shape of a partly-cut-away rectangle frame as seen in a plan view. Moreover, in the frame body 3, the input-output terminal 4 is disposed in the cutout C. Furthermore, the frame body 3 may be designed to have a through hole H formed in its part facing the cutout C. The frame body 3 is brazed to the substrate 2 via a brazing material.

Moreover, the frame body 3 is made of, for example, a metal material such as copper, iron, tungsten, molybdenum, nickel, or cobalt, or an alloy containing such metal materials. The frame body 3 has the capability of dissipating heat generated from the device within the frame body 3 to the exterior of the frame body 3 with high efficiency. The thermal conductivity of the frame body 3 is set to fall in the range of 15 W/(m·K) or more and 450 W/(m·K) or less, for example. The thermal expansion coefficient of the frame body 3 is set to fall in the range of $3 \times 10^{-6}$/K or more and $28 \times 10^{-6}$/K or less, for example.

Moreover, the frame body 3 has such dimensions as to conform to the substrate 2 as seen in a plan view, and more specifically, the length of one side of the frame body 3 is set to fall in the range of 5 mm or more and 50 mm or less, for example. Moreover, the thickness of the frame body 3 excluding the cutout 3 in the vertical direction thereof is set to fall in the range of 1 mm or more and 10 mm or less, for example. Furthermore, the thickness of the frame body 3 including the cutout 3 in the vertical direction thereof is set to fall in the range of 5 mm or more and 20 mm or less, for example. In addition, the thickness of the frame part of the frame body 3 as seen in a plan view is set to fall in the range of 0.5 mm or more and 3 mm or less, for example.

The input-output terminal 4 is disposed in the cutout C of the frame body 3. Moreover, the frame body 3 has, in its part formed with the through hole H, a light-transmittable member for allowing light transmitted thereto from an externally disposed optical fiber to travel through the interior of the frame body 3. In the through hole H, there is disposed a holding member 12 in which the light-transmittable member 11 such for example as a lens, plastics, glass, or a sapphire substrate can be fitted. The holding member 12 may be designed to hold the light-transmittable member 11, with the front end of the optical fiber moved close to the light-transmittable member 11 from the exterior of the frame body 3.

Figure 8:
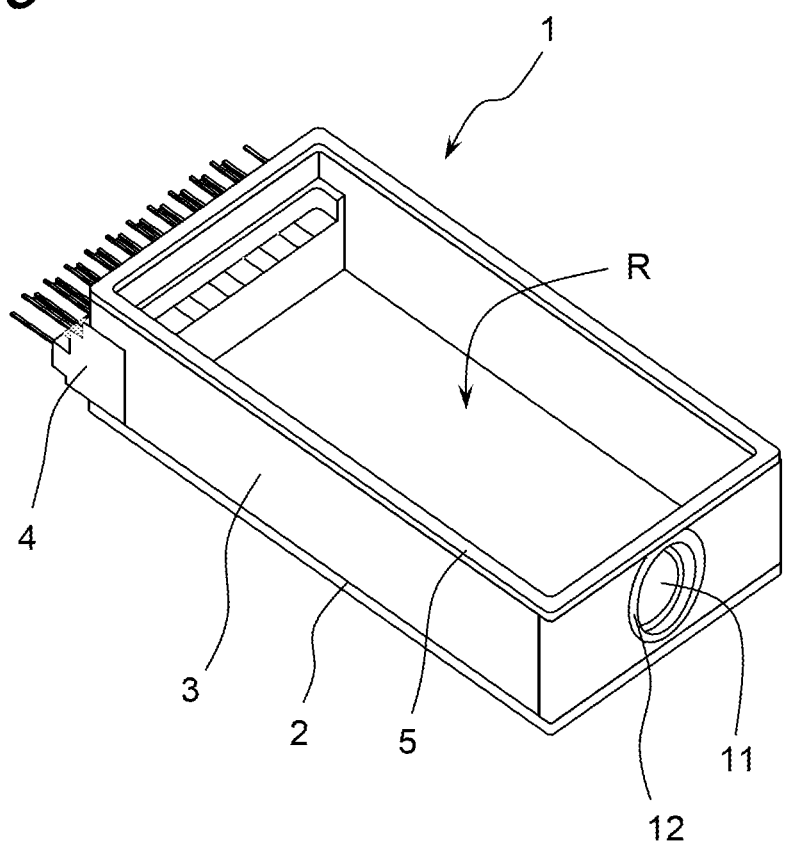
FIG. 8 is a perspective top view of the device housing package corresponding to FIG. 1, schematically showing the device housing package in a state where a holding member and a light-transmittable member are fitted in a through hole.
Figure 9:
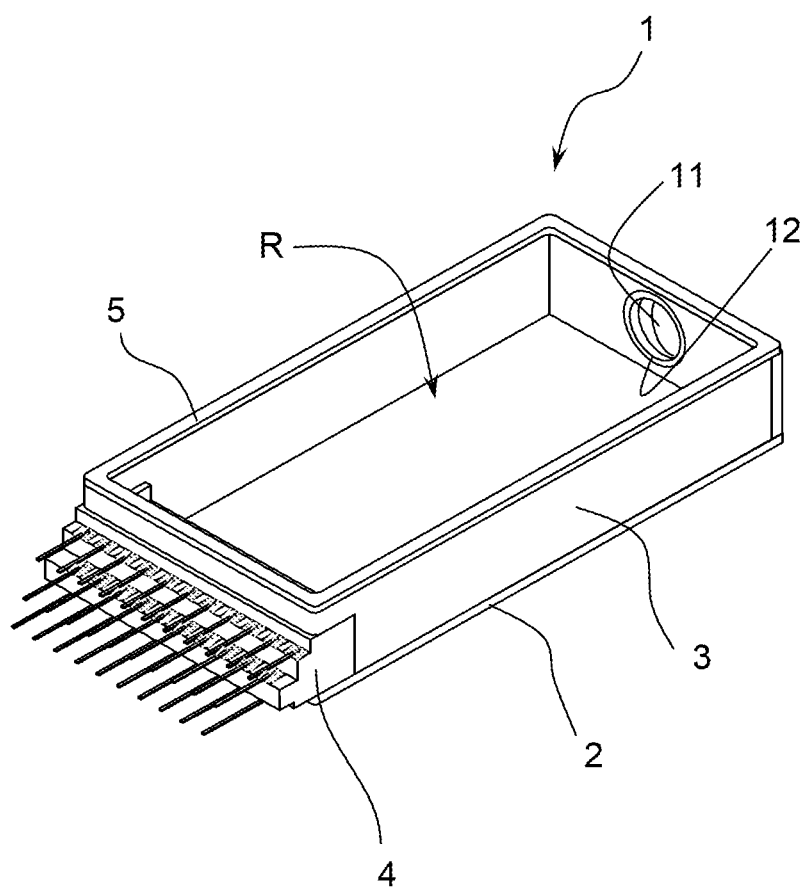
FIG. 9 is a perspective top view of the device housing package corresponding to FIG. 2, schematically showing the device housing package in a state where a holding member and a light-transmittable member are fitted in a through hole.

The frame body 3 has the through hole H formed in its part facing the cutout C. As shown in FIGS. 8 and 9, the holding member 12 holding the light-transmittable member 11 is disposed in the through hole H. The light-transmittable member 11 is, where an optical semiconductor device is mounted inside the frame body 3, positioned at a level at which light emitted from the optical semiconductor device travels. In a case where the device is an optical semiconductor device, the optical semiconductor device is placed on the mounting region R so that an optical axis of the optical semiconductor device is brought into coincidence with an optical axis of the light-transmittable member 11. The holding member 12 is made of, for example, a metal such as copper, tungsten, iron, nickel, or cobalt, or an alloy containing two or more of these metals.

The light-transmittable member 11 is attached to the holding member 12 so as to seal the through hole H. The light-transmittable member 11 allows light to transmit therethrough, and acts to maintain the air tightness of the interior of the frame body 3. Moreover, the light-transmittable member 11 has the capability of converging optical signals emitted from the optical semiconductor device, or converting such optical signals into parallel light. Therefore, the light-transmittable member 11 is capable of making adjustment to an optical axis of an optical signal emitted from the optical semiconductor device.

Moreover, the input-output terminal 4 may be disposed in the cutout C opposed to the light-transmittable member 11. As a result, it is possible to reduce the length of the device housing package 1 in a direction perpendicular to an optical axis of the through hole H in which the light-transmittable member 11 and the optical fiber are retained, and thereby achieve downsizing of the device housing package 1. Therefore, the device housing packages 1 can be densely mounted on an external circuit board. Moreover, it is preferable that the frame body 3 and the input-output terminal 4 are each designed in linearly symmetrical form with respect to the optical axis of the through hole H for retaining the light-transmittable member 11 and the optical fiber as seen in a plan view. As a result, given that deformation appears in the device housing package 1 due to a difference in thermal expansion coefficient between the substrate 2, the frame body 3 and the input-output terminal 4, or due to a thermal stress, the device housing package 1 becomes deformed linearly symmetrically with respect to the optical axis of the through hole H as seen in a plan view, wherefore the deviation of its optical axis from the optical axis of the through hole H can be suppressed. Accordingly, the device housing package 1 is capable of effecting light input and output smoothly between the optical semiconductor device housed therein and the optical fiber.

Moreover, a seal ring 5 is disposed on the frame body 5 and extends along the upper surface of the frame body 3. The role of the seal ring 5 is, when a lid body is disposed so as to cover the interior of the frame body 3, to make connection with the lid body. The seal ring 5 is made of a metal which can be excellently seam-welded to the lid body, for example, copper, tungsten, iron, nickel, or cobalt, or an alloy containing two or more of such metals.

The input-output terminal 4 is a member which is disposed in the cutout C of the frame body 3. The input-output terminal 4 has a structure formed of a plurality of stacked insulating layers, and more specifically includes a first insulating layer 4a, a second insulating layer 4b overlaid on the first insulating layer 4a, and a third insulating layer 4c overlaid on the second insulating layer 4b. In addition, in the input-output terminal 4, a fourth insulating layer 4d is formed on a lower surface of the first insulating layer 4a.

The first insulating layer 4a extends outwardly from the frame body 3 beyond the second insulating layer 4b and the third insulating layer 4c, and, the second insulating layer 4b extends outwardly beyond the third insulating layer 4c from the frame body 3. Moreover, the fourth insulating layer 4d, while extending outwardly beyond the second insulating layer 4b from the frame body 3, does not extend as much as the first insulating layer 4a. Furthermore, a plurality of first terminals 6 set at a predetermined potential are disposed on an upper surface of the first insulating layer 4a; a plurality of second terminals 7 set at a predetermined potential are disposed on the lower surface of the first insulating layer 4a; and a plurality of third terminals 8 through which AC signals flow are disposed on an upper surface of the second insulating layer 4b.

The first insulating layer 4a, the second insulating layer 4b, and the third insulating layer 4c are made of an insulating material, for example, a ceramic material such as sintered aluminum oxide, sintered mullite, sintered silicon carbide, sintered aluminum nitride, sintered silicon nitride, or glass ceramics. Moreover, the upper surface of the first insulating layer 4a bearing the first terminals 6, the lower surface of the first insulating layer 4a bearing the second terminals 7, and the upper surface of the second insulating layer 4b bearing the third terminals 8 are each formed with metal layers 9 that are connected to their respective terminals. Furthermore, the metal layers 9 are formed on each of the first insulating layer 4a and the second insulating layer 4b in correspondence with their respective terminals. In addition, an upper surface of the third insulating layer 4c and a lower surface of the fourth insulating layer 4d are each formed with a metallized pattern for making connection with the frame body 3 via a brazing material. The metal layer 9 and the metallized pattern are made of, for example, a metal material having a high melting point such as tungsten, molybdenum, or manganese. The thermal expansion coefficients of the ceramic-made first insulating layer 4a, the ceramic-made second insulating layer 4b, and the ceramic-made third insulating layer 4c are set to fall in the range of $3\times10^{-6}$/K or more and $8\times10^{-6}$/K or less, for example.

Now, a method of producing the input-output terminal 4 will be explained. A plurality of metal layers 9 are formed on the upper and lower surfaces of the first insulating layer 4a in a yet-to-be-fired, uncured state, as well as on the upper surface of the second insulating layer 4b in the same state, by a thick-film forming technique such as a screen printing method, or a thin-film forming technique such as a vapor deposition method or a sputtering method. In addition, a metallized pattern is formed on the upper surface of the third insulating layer 4c and the lower surface of the fourth insulating layer 4d in a manner similar to that adopted in the formation of the metal layers 9. Then, the stacked first insulating layer 4a, second insulating layer 4b, third insulating layer 4c, and fourth insulating layer 4d are co-fired. In this way, the input-output terminal 4 can be produced. The metal layer 9 is disposed so as to extend from one end to the other end of the upper surface of the first insulating layer 4a, is disposed so as to extend from one end to the other end of the lower surface of the first insulating layer 4a, and is disposed so as to extend from one end to the other end of the upper surface of the second insulating layer 4b. The metallized pattern is formed on each of the upper surface of the third insulating layer 4c and the lower surface of the fourth insulating layer 4d so as to be positioned for making connection with the frame body 3.

Following the completion of firing, the first insulating layer 4a, the second insulating layer 4b, the third insulating layer 4c, and the fourth insulating layer 4d are integrated to form the input-output terminal 4 in a single-piece construction. When the input-output terminal 4 is seen in a plan view, the metal layer 9 is so disposed as to extend from the region surrounded with the frame body 3 to the exterior thereof. As a result, the device lying inside the frame body 3 and external electronic equipment located outside of the frame body 3 can be electrically connected to each other via the metal layer 9.

The first terminal 6, the second terminal 7, and the third terminal 8 are members for making electrical connection with external electronic equipment. The first terminal 6, the second terminal 7, and the third terminal 8 are connected to the metal layer 9 via a brazing material. The first terminal 6, the second terminal 7, and the third terminal 8 are each electrically connected to the metal layer 9.

Moreover, the metal layer 9 is disposed in correspondence with each terminal. The metal layers 9 are disposed in a manner such that a plurality of adjacent first terminals 6, as well as a plurality of adjacent second terminals 7 and a plurality of adjacent third terminals 8, can be spaced apart for ensuring electrical insulation.

The first terminal 6 and the second terminal 7 are each set at a predetermined potential of a fixed value such as a ground potential or a DC voltage. Moreover, the third terminal 8 is designed to permit the flow of a radio-frequency signal which is an AC signal.

In this construction, part of the first terminals 6 serves as a terminal for grounding conductor, and part of the second terminals 7 serves as a terminal for DC voltage. Since part of the first terminals 6 is a terminal for grounding conductor, part of the second terminals 7 is a terminal for DC voltage, and the third terminal 8 is a terminal for AC signals, even if DC voltages of a plurality of different values are applied to the second terminal 7 especially due to the placement of the first terminal 6 for grounding conductor between the underside of the third terminal 8 and the second terminal 7, it is likely that an electric field distribution from the third terminal 8 will occur between the third terminal 8 and the first terminal 6 located near the third terminal 8. As a result, occurrence of the electric field distribution, capacitive components and a resonance phenomenon between the third terminal 8 and the second terminal 7 can be suppressed. Thus, the third terminal 8 is capable of maintaining desired characteristic impedance, wherefore smooth inputting and outputting of AC signals can be effected via the third terminal 8.

Figure 5:
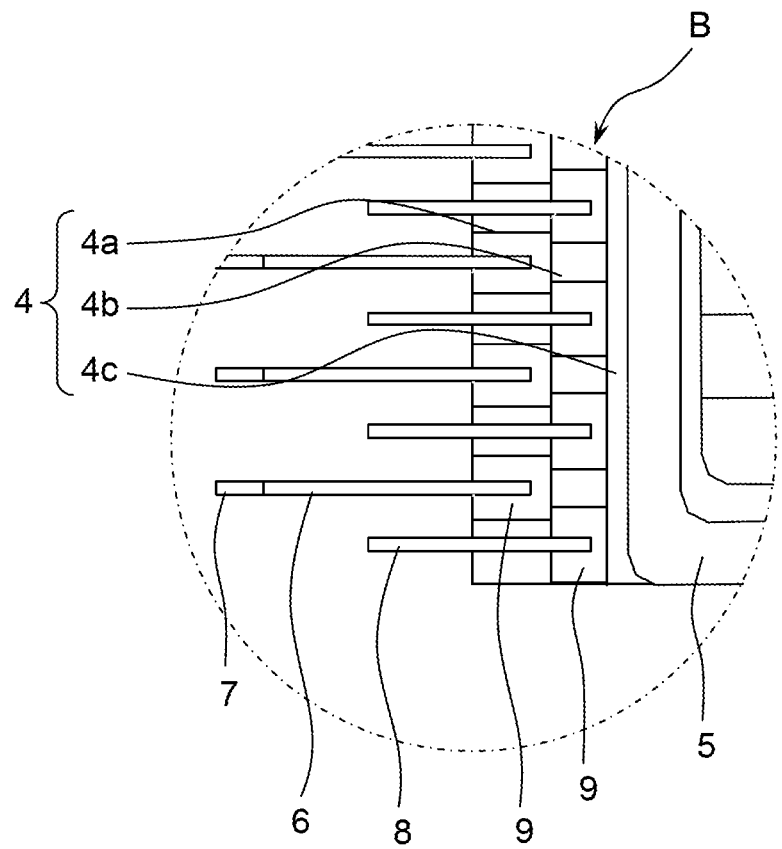
FIG. 5 is a plan view of a B section of the input-output terminal in FIG. 4.

As shown in FIG. 5, each of the plurality of third terminals 8 is situated between a plurality of the first terminals 6 as seen in a plan view, and, the third terminals 8 and their adjacent first terminals 6 are disposed with equal spacing. That is, the third terminal 8 is located centrally of the region between the plurality of first terminals 6 as seen in a plan view.

If the third terminal 8 and the first terminal 6 overlap each other as seen in a plan view, the distance between the first terminal 6 and the third terminal 8 will decrease, which causes a strengthening of the electromagnetic-field coupling between the first terminal 6 and the third terminal 8, and, fluctuation in electrostatic capacitance resulting from the strengthening may lead to an impedance mismatch in the third terminal 8, and also, the electromagnetic-field coupling between the first terminal 6 and the third terminal 8 may lead to a resonance phenomenon. Moreover, in the case of downsizing the first terminal 6 and the third terminal 8 to reduce capacitive components that increase with a decrease in the distance between the first terminal 6 and the third terminal 8, the strength of adhesion and adherability at the junction between the first, third terminal 6, 8 and the input-output terminal 4 as well as an external circuit board is deteriorated. This makes it difficult to perform efficient transmission of an AC signal which is transmitted through the third terminal 8. Furthermore, a noise signal may be easily added to an AC signal propagating through the third terminal 8. In addition, the first terminal 6 the third terminal 8 and the input-output terminal 4 as well as an external circuit board are prone to poor connection. This may give rise to the problem of being unable to achieve inputting and outputting of a radio-frequency signal derived from an AC signal properly and exactly between the device housed in the device housing package 1 and an external circuit board connected to the third terminal 8.

Furthermore, if the third terminals 8 and their adjacent first terminals 6 are disposed at various spacings as seen in a plan view, due to lack of uniformity in distances between the third terminals 8 and their adjacent first terminal 6, it will be difficult to render the electromagnetic field distributions between the third terminals 8 and their adjacent first terminals 6 symmetrical with respect to a plane perpendicular to the second insulating layer 4b extending along the lengthwise direction of the third terminal 8, which results in unevenness in the electromagnetic field distributions between the third terminals 8 and their adjacent first terminals 6.

In view of the foregoing, the third terminal 8 is placed so as not to overlap the first terminal 6, and the distance between the third terminal 8 and the first terminal 6 is increased, and also, the third terminals 8 and their adjacent first terminals 6 are disposed with equal spacing. This makes it possible to suppress an impedance mismatch caused in the third terminal 8 by the electromagnetic-field coupling between the third terminal 8 and the first terminal 6 and a resonance phenomenon caused by the electromagnetic-field coupling between the first terminal 6 and the third terminal 8, and thereby perform efficient transmission of an AC signal which is transmitted through the third terminal 8. As a result, it is less likely that a noise signal will be added to an AC signal propagating through the third terminal 8, wherefore proper and exact inputting and outputting of a radio-frequency signal derived from an AC signal can be achieved between the device housed in the device housing package 1 and an external circuit board connected to the third terminal 8.

Moreover, each of the plurality of third terminals 8 is situated between the plurality of second terminals 7 as seen in a plan view, and, the third terminals 8 and their adjacent first terminals 6 are disposed with equal spacing. That is, the third terminal 8 is located centrally of the region between the plurality of first terminals 6 as seen in a plan view.

The third terminal 8 is placed so as not to overlap the second terminal 7, and the distance between the third terminal 8 and the second terminal 7 is increased, and also, the third terminals 8 and their adjacent second terminals 7 are disposed with equal spacing. As a result, an impedance mismatch caused in the third terminal 8 by the electromagnetic-field coupling between the third terminal 8 and the second terminal 7, and a resonance phenomenon caused by the electromagnetic-field coupling between the second terminal 7 and the third terminal 8 can be suppressed. Moreover, efficient transmission of an AC signal which is transmitted through the third terminal 8 is performed, as well as it is less likely that a noise signal will be added to an AC signal, and thereby it is possible to achieve inputting and outputting of a radio-frequency signal derived from an AC signal properly and exactly between the device housed in the device housing package 1 and an external circuit board connected to the third terminal 8.

Figure 6:
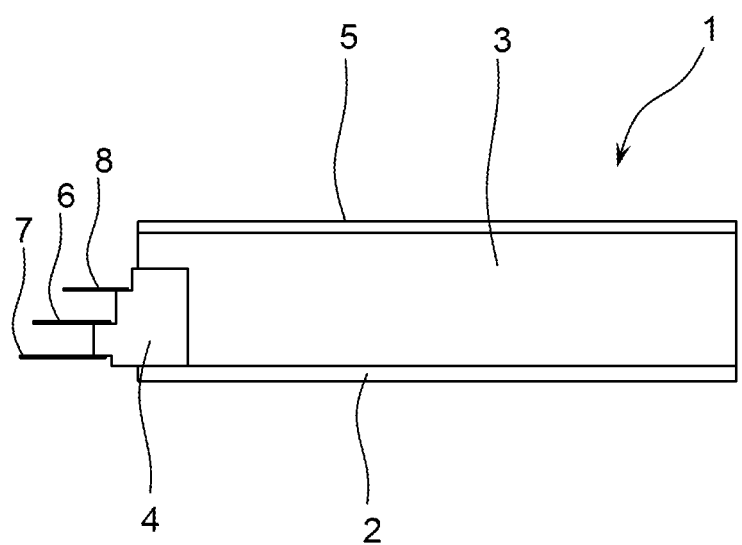
FIG. 6 is a side view of the device housing package in accordance with one embodiment of the invention.

As shown in FIG. 6, the first terminal 6, the second terminal 7, and the third terminal 8 extend along the upper surface of the substrate 2 in the planar direction. Moreover, the distance between the first terminal 6 and the second terminal 7 in the vertical direction thereof is set at a uniform value which falls in the range of 0.3 mm or more and 3 mm or less, for example. Since the vertical distance between the first terminal 6 and the second terminal 7 is uniform, it is possible to interpose an external flexible printed circuit board having a wiring pattern formed on each of the upper and lower surfaces thereof between the first terminal 6 and the second terminal 7. In this case, the first terminal 6 and the second terminal 7 are electrically connected to the wiring pattern formed on the upper surface of the flexible printed circuit board and the wiring pattern formed on the lower surface thereof, respectively.

As shown in FIG. 6, the plurality of second terminals 7 extend outwardly beyond the plurality of first terminals 6 from the frame body 3 as seen in a plan view. In the case where the second terminal 7 extends beyond the first terminal 6, the external flexible printed circuit board can be put on the upper surface of the second terminal 7, and is then slidingly moved along the upper surface of the second terminal 7 so as to be inserted between the first terminal 6 and the second terminal 7. This makes it possible to facilitate the placement of the flexible printed circuit board between the first terminal 6 and the second terminal 7, and thereby reduce the time required for the electrical connection of the flexible printed circuit board with the input-output terminal 4. Thus, the flexible printed circuit board can be sandwiched between the first terminal 6 and the second terminal 7, and whereafter the first terminal 6 and the second terminal 7 can be electrically connected to the wiring patterns formed on the upper and lower surfaces of the flexible printed circuit board via solder.

Alternatively, the plurality of first terminals 6 may extend outwardly beyond the plurality of second terminals 7 from the frame body 3 as seen in a plan view. In the case where the first terminal 6 extends beyond the second terminal 7, for example, when a flexible printed circuit board, which is formed with penetrating portions positioned in correspondence with their respective terminals of the input-output terminal 4 as seen in a lateral view from the side opposite to the side bearing the through hole H, and wiring patterns electrically connected to the penetrating portions, is mounted in a manner such that the terminals are inserted into their respective penetrating portions from the side opposite to the side bearing the through hole H for establishing electrical connection with all the terminals at one time, by inserting the first terminal 6 spaced a short distance away from the second terminal 7 and the third terminal 8 into the through portion first, it is possible to reduce misalignment of the penetrating portions into which the second terminal 7 and the third terminal 8 are inserted with respect to the first terminal 6. Moreover, by inserting the second terminal 7 into the through portion after the insertion of the first terminal 6 in the through portion, it is possible to bring the first terminal 6 and the second terminal 7 into alignment with their respective penetrating portions, and thereby minimize misalignment between the third terminal 8 and the through portion. As a result, poor electrical connection and deformation caused by a failure of proper insertion of the third terminal 8 in the through portion can be suppressed, and, the insertion of the first terminal 6 in the through portion allows proper alignment of the penetrating portions corresponding to the second terminal 7 and the third terminal 8, whereby all the terminals can be electrically connected to the flexible printed circuit board at one time, with a consequent considerable reduction in the mounting-structure production lead time.

According to the present embodiment, since a plurality of terminals of different types can be arranged at various heights relative to the input-output terminal 4, it is possible to increase the number of lead terminals without the necessity of upsizing the package in itself. Moreover, an impedance mismatch caused in the third terminal 8 by the electromagnetic-field coupling between the third terminal 8 and the first terminal 6 as well as the second terminal 7 adjacent thereto, and a resonance phenomenon caused by the electromagnetic-field coupling between the first terminal 6 as well as the second terminal 7 and the third terminal 8 can be suppressed, and also, efficient transmission of an AC signal which is transmitted through the third terminal 8 is performed, and it is less likely that a noise signal will be added, and thereby it is possible to achieve inputting and outputting of a radio-frequency signal derived from an AC signal properly and exactly between the device housed in the device housing package 1 and an external circuit board connected to the third terminal 8.

<Method of Producing Device Housing Package>

Figure 2:
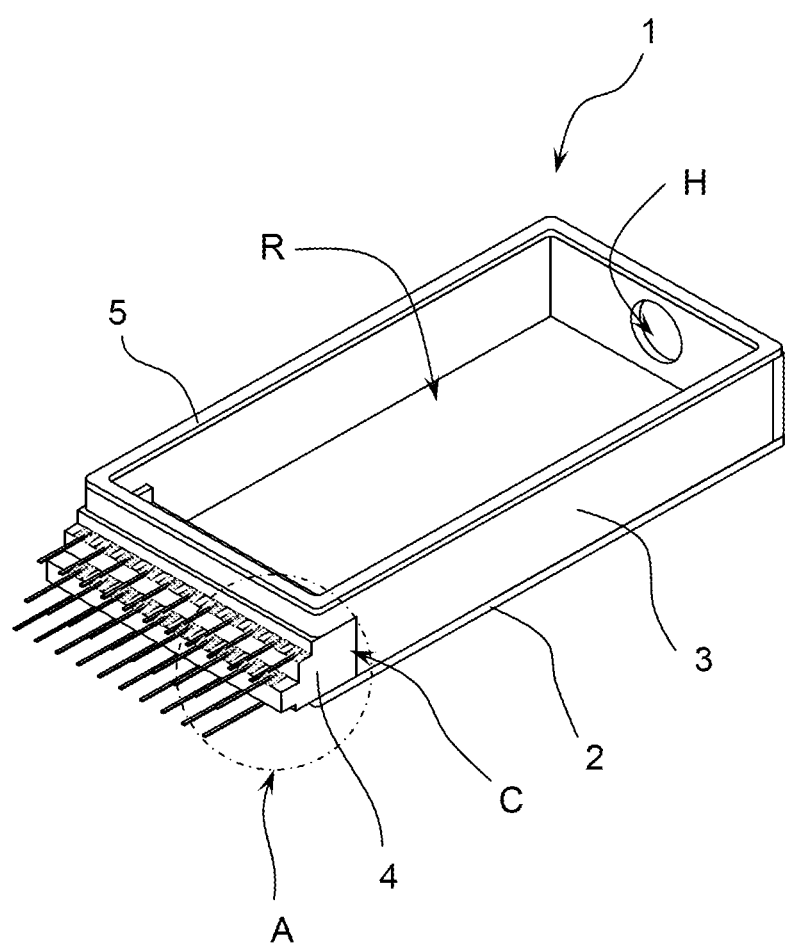
FIG. 2 is a perspective top view of a device housing package in accordance with one embodiment of the invention, schematically showing the device housing package as viewed from the front to the rear of an input-output terminal.
Figure 3:
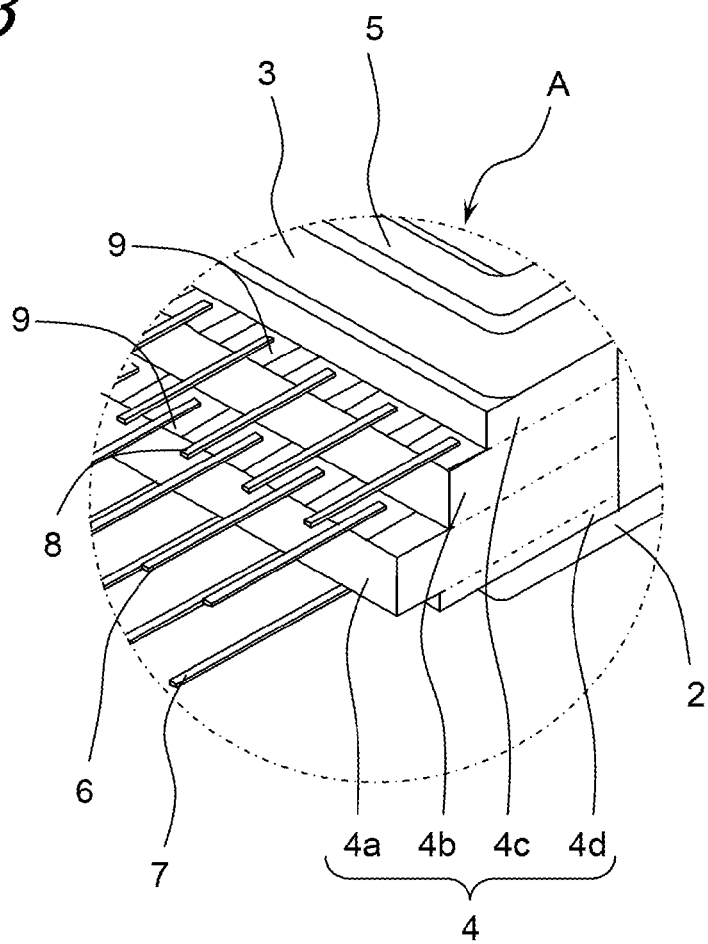
FIG. 3 is an enlarged perspective view of an A section of the input-output terminal in FIG. 2.
Figure 4:
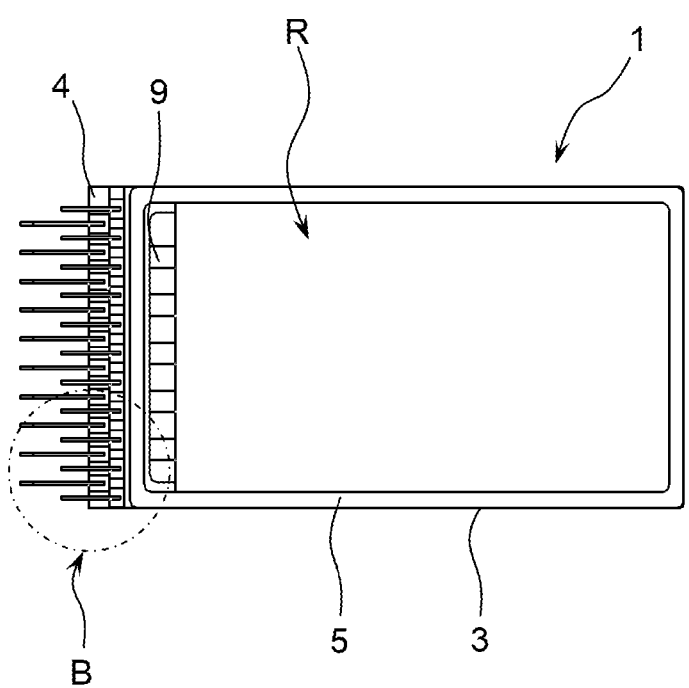
FIG. 4 is a plan view of the device housing package in accordance with one embodiment of the invention.

Now, a method of producing the device housing package 1 as shown in FIG. 1 or 2 will be explained. The first step is to prepare the substrate 2, the frame body 3, and the input-output terminal 4. The substrate 2 and the frame body 3 are each formed in a predetermined shape by performing metalworking process on an ingot obtained by casting a molten metal material in a mold and solidifying the molten metal material.

In forming the input-output terminal 4, ceramic green sheets corresponding to various constituent insulating layers are prepared. Next, the metal layer 9 made of a metal paste coated with an organic solvent containing molybdenum and manganese is formed on the ceramic green sheet by the screen printing method, for example. The input-output terminal 4 is formed by firing the stacked ceramic green sheets. Then, a metallized pattern is formed on a surface of the input-output terminal 4 that is joined to the frame body 3, by the screen printing method. Moreover, various terminals are connected to their respective metal layers 9 of the input-output terminal 4 via a brazing material. In this way, the input-output terminal 4 can be produced. Furthermore, in connecting the thusly prepared frame body 3, the holding member 12 equipped with the light-transmittable member 11 is fitted in the through hole H of the frame body 3 via a brazing material.

Next, the substrate 2, the frame body 3, and the input-output terminal 4 thusly prepared are connected to one another via a brazing material. Specifically, the input-output terminal 4 is placed on the substrate 2, and the frame body 3 is placed on the substrate 2 so that the input-output terminal 4 can be inserted into the cutout C, and in this condition they are connected to one another at one time via a brazing material. In this way, the device housing package 1 can be produced. Moreover, an insulating wiring substrate is disposed on the mounting region R of the device housing package 1, and a device is mounted on this wiring substrate via solder, and, after the device, the wiring substrate, and the input-output terminal 4 are electrically connected to one another by a bonding wire, the device housing package is covered with a lid body, whereupon a mounting structure can be produced.

Modified Example

Figure 7:
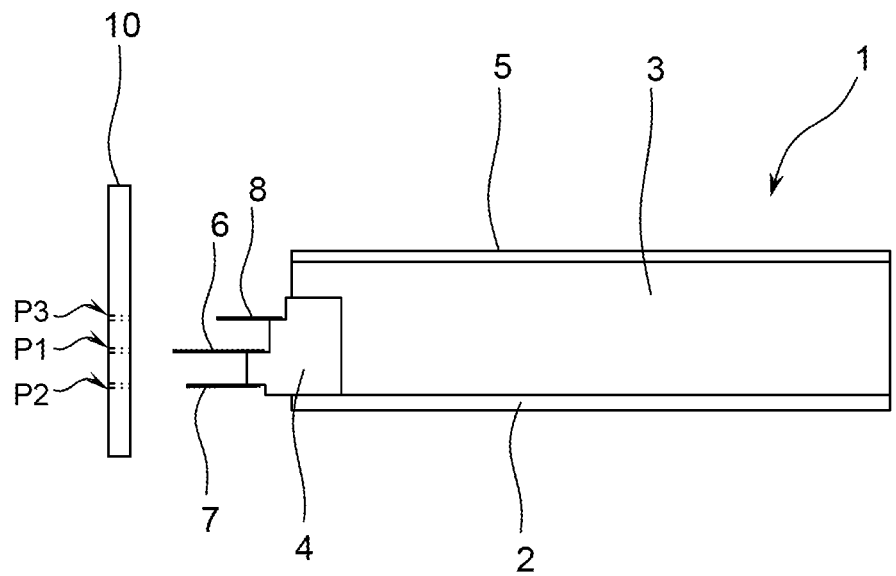
FIG. 7 is a side view of the device housing package in accordance with one modified example.

The invention is not limited to the embodiments described hereinabove, and therefore various changes, modifications, and improvements are possible without departing from the scope of the invention. Hereinafter, a modified example of the present embodiment will be explained. Note that the constituent components of a device housing package and a mounting structure in accordance with the modified example of the present embodiment that are similar to those of the device housing package and the mounting structure of the present embodiment will be identified with the same reference symbols, and relevant descriptions will be omitted. FIG. 7 is a side view of a device housing package 1 of one modified example, which corresponds to FIG. 6.

In the embodiment thus far described, the second terminal 7 extends outwardly beyond the first terminal 6 from the frame body 3, but the invention is not limited to such a structure. For example, such a structure as shown in FIG. 7 can be adopted in which one end of the first terminal 6 located outside of the frame body 3 extends outwardly from the frame body 3 beyond one end of the second terminal 7 located outside of the frame body 3.

In this modified example, the first terminal 6 is placed on the exposed upper surface of the first insulating layer 4a of the input-output terminal 4, and the second terminal 7 is placed on the exposed lower surface of the first insulating layer 4a of the input-output terminal 4. In this structure, the first terminal 6 has its one end extended outwardly from the frame body 3 beyond one end of the second terminal 7. That is, one end of the first terminal 6 extends outwardly beyond one end of the second terminal 7 from the frame body 3. On the other hand, the other end of the first terminal 6 is placed so as to overlap the other end of the second terminal 7 as seen in a plan view. A difference between one end of the first terminal 6 and one end of the second terminal 7 is set to fall in the range of 1 mm or more and 5 mm or less, for example.

In the case where one end of the first terminal 6 extends outwardly beyond one end of the second terminal 7 from the frame body 3, even if an external member is brought close to and into contact with the first terminal 6 from above the first terminal 6 and consequently a force is exerted in a direction from the first terminal 6 to the second terminal 7, it is possible to decrease the possibility that the front end of the first terminal 6 will make contact with the second terminal 7. Thus, since one end of the first terminal 6 extends outwardly beyond one end of the second terminal 7 from the frame body 3, even if a force is exerted in a direction from the first terminal 6 to the second terminal 7 when an external member is brought close to and into contact with the first terminal 6 from above the first terminal 6, the possibility of the contact of the front end of the first terminal 6 with the second terminal 7 can be reduced. That is, even if the front end of the first terminal 6 bends or deforms toward the second terminal 7 by the amount of the distance between the first terminal 6 and the second terminal 7, it is less likely that the front end of the first terminal 6 will make contact with the second terminal 7. However, if one end of the first terminal 6 does not extend outwardly beyond one end of the second terminal 7 from the frame body 3, when the front end of the first terminal 6 bends or deforms toward the second terminal 7 by the amount of the distance between the first terminal 6 and the second terminal 7, the front end of the first terminal 6 will be easily brought into contact with the second terminal 7. Accordingly, so long as one end of the first terminal 6 extends outwardly beyond one end of the second terminal 7 from the frame body 3, it is less likely that the first terminal 6 will be brought into contact with the second terminal 7 under a force exerted in the direction from the first terminal 7 to the second terminal 8.

Moreover, since one end of the first terminal 6 extends outwardly beyond one end of the second terminal 7 from the frame body 3, it is possible to easily apply probes to the first terminal 6 from above and below so as to sandwich one end of the first terminal 6 therebetween, and thereby allow the easy checking of the continuity of the first terminal 6. If the second terminal 7 is longer than the first terminal 6, it is difficult to sandwich the first terminal 6 from above and below, but the second terminal 7 is easily brought into contact with the probes. In light of this, by designing the first terminal 6 to be longer than the second terminal 7, it is possible to allow the easy checking of the continuity of the first terminal 6.

Moreover, the first terminal 6, being longer than the second terminal 7 and the third terminal 8, can be readily connected first to an easily deformable flexible board 10. In order to connect the easily deformable flexible board 10 with the input-output terminal 4, following the insertion of the first terminal 6 in a conduction hole p1, conduction holes p2 and p3 of the flexible board 10 in a deformed state are brought into alignment with the second terminal 7 and the third terminal 8, respectively. Then, the second terminal 7 is inserted into the conduction hole p2, and the third terminal 8 is inserted into the conduction hole p3, whereby the respective terminals can be connected to the flexible board 10. If the second terminal 7 or the third terminal 8 is longer than the first terminal 6, the second terminal 7 or the third terminal 8 will be the first to be inserted into the flexible board 10, which makes it difficult to arrange the terminals in proper alignment with their respective conduction holes of the easily deformable flexible board 10 for insertion. In light of this, by designing the first terminal 6 to be longer than the second terminal 7 and the third terminal 8, it is possible to insert the first terminal 6 into the conduction hole p1 first, and thereby bring the second terminal 7 and the third terminal 8 into alignment with their respective conduction holes with ease.

Moreover, the first terminal 6, the second terminal 7, and the third terminal 8 may be so arranged that the vertical distance between them increases with a decrease in the lengths of the first terminal 6, the second terminal 7, and the third terminal 8. In this case, the larger the distance between the first terminal 6, the second terminal 7, and the third terminal 8 becomes, the greater the displaceable range of the flexible board 10 situated between the first terminal 6, the second terminal 7, and the third terminal 8 becomes. As a result, a stress developed in the flexible board 10 due to the difference in length between the first terminal 6, the second terminal 7, and the third terminal 8 can be relaxed by the displacement of the flexible board 10, the amount of which is increased with an increase in the distance between the first terminal 6, the second terminal 7, and the third terminal 8. Accordingly, stress concentration on a certain part of the flexible board 10 is suppressed.

The invention claimed is:

1. A device housing package, comprising:
    a substrate in a form of a rectangle, having a mounting region of a device at an upper surface thereof;
    a frame body disposed on the substrate to extend along an outer periphery of the mounting region, the frame body having a cutout formed at a part thereof; and
    an input-output terminal which is disposed in the cutout to extend from a region thereof, which is surrounded with the frame body, to a region which is not surrounded with the frame body,
    the input-output terminal including a first insulating layer, a second insulating layer overlaid on the first insulating layer, and a third insulating layer overlaid on the second insulating layer,
    the first insulating layer extending outwardly from the frame body beyond the second insulating layer and the third insulating layer,
    the second insulating layer extending outwardly beyond the third insulating layer from the frame body,
    a plurality of first terminals set at a predetermined potential disposed on an upper surface of the first insulating layer,
    a plurality of second terminals set at a predetermined potential disposed on a lower surface of the first insulating layer, and
    a plurality of third terminals through which Alternating Current (AC) signals flow, disposed on an upper surface of the second insulating layer.

2. The device housing package according to claim 1, wherein each of the plurality of third terminals is situated between the plurality of first terminals.

3. The device housing package according to claim 2, wherein each of the plurality of first terminals and each of the plurality of second terminals vertically overlap each other.

4. The device housing package according to claim 3, wherein one end of each of the plurality of first terminals extends outwardly from the frame body beyond one end of each of the plurality of second terminals.

5. The device housing package according to claim 1, wherein the plurality of first terminals include a terminal for grounding conductor, and the plurality of second terminals include a terminal for Direct Current (DC) voltage.

6. The device housing package according to claim 1, wherein the frame body has a through hole formed in its part facing the cutout, and
    the device housing package further comprises a holding member holding a light-transmittable member, the holding member being disposed in the through hole.

7. The device housing package according to claim 6, wherein the device is an optical semiconductor device, and the optical semiconductor device is placed on the mounting region so that an optical axis of the optical semiconductor device is brought into coincidence with an optical axis of the light-transmittable member.

8. The device housing package according to claim 1, wherein the input-output terminal is electrically connected to a flexible board.

\* \* \* \* \*